United States Patent
Bishop et al.

(10) Patent No.: US 11,152,189 B2
(45) Date of Patent: Oct. 19, 2021

(54) METHOD AND SYSTEM FOR PLASMA ASSISTED LOW VACUUM CHARGED-PARTICLE MICROSCOPY

(71) Applicant: FEI Company, Hillsboro, OR (US)

(72) Inventors: James Bishop, Randwick (AU); Daniel Totonjian, Forest Lodge (AU); Chris Elbadawi, Little Bay (AU); Charlene Lobo, Redfern (AU); Milos Toth, Redfern (AU)

(73) Assignee: FEI Company, Hillsboro, OR (US)

( * ) Notice: Subject to any disclaimer, the term of this patent is extended or adjusted under 35 U.S.C. 154(b) by 23 days.

(21) Appl. No.: 16/823,140

(22) Filed: Mar. 18, 2020

(65) Prior Publication Data
US 2021/0296086 A1    Sep. 23, 2021

(51) Int. Cl.
*H01J 37/244*    (2006.01)
*H01J 37/28*    (2006.01)

(52) U.S. Cl.
CPC ............ *H01J 37/244* (2013.01); *H01J 37/28* (2013.01); *H01J 2237/006* (2013.01); *H01J 2237/2448* (2013.01)

(58) Field of Classification Search
CPC .. H01J 37/244; H01J 37/28; H01J 2237/2448; H01J 2237/006
USPC ......................................................... 250/310
See application file for complete search history.

(56) References Cited

U.S. PATENT DOCUMENTS

| | | | |
|---|---|---|---|
| 4,983,253 A * | 1/1991 | Wolfe | H01J 37/3402 156/345.46 |
| 6,972,412 B2 | 12/2005 | Scholtz et al. | |
| 2008/0035861 A1* | 2/2008 | Knowles | G01N 23/225 250/492.3 |
| 2011/0248164 A1* | 10/2011 | Straw | H01J 37/28 250/307 |
| 2015/0380207 A1 | 12/2015 | Shachal et al. | |
| 2018/0095067 A1* | 4/2018 | Huff | G01N 33/48721 |
| 2019/0206664 A1* | 7/2019 | De Marco | H01J 37/32009 |
| 2020/0035443 A1 | 1/2020 | He et al. | |

FOREIGN PATENT DOCUMENTS

DE    102015204091 A1    9/2016

OTHER PUBLICATIONS

Trisha Rice and Ralph Knowles, Ultra High Resolution SEM on Insulators and Contaminating Samples, Microscopy Today, May 2005, pp. 40-42, vol. 13, Issue 3.
Danilatos G.D: "Theory of the Gaseous Detector Device in the Environmental Scanning Electron Microscope," Microelectronics and Microscopy; In: Advances in Electronics and Electron Physics, Academic Press Inc, Jan. 1, 1990 (Jan. 1, 1990), vol. 78, XP000965138, pp. 1-102.
EP21162792.2, Extended European Search Report, dated Aug. 6, 2021, 15 pages.

* cited by examiner

*Primary Examiner* — David A Vanore

(57) ABSTRACT

Various methods and systems are provided for imaging a sample under low vacuum with a charged particle beam. A magnetic field is provided in a detection area of the detector. Gas and plasma are provided in the detection area while detecting charged particles emitted from the sample. Sample image is formed based on the detected charged particles.

20 Claims, 9 Drawing Sheets

METHOD AND SYSTEM FOR PLASMA ASSISTED LOW VACUUM CHARGED-PARTICLE MICROSCOPY

FIELD OF THE INVENTION

The present description relates generally to methods and systems for low vacuum charged particle microscopy, and more particularly, to generating high quality sample image based on secondary electrons detected in a gaseous environment.

BACKGROUND OF THE INVENTION

Low vacuum scanning electron microscopy (SEM) or environmental SEM allows imaging a nonconductive sample in a gaseous environment using a gaseous secondary electron detector (GSED). Low vacuum SEM provides a means to stabilize sample charging and perform dynamic chemical experiments within an SEM setting. However, resolution and contrast of the low vacuum SEM is inferior to the high vacuum SEM due to different detector design and increased electron beam scattering in the gaseous environment.

One method to improve the image quality in low vacuum SEM is introduced in U.S. Pat. No. 6,972,412. Therein, an electron field and a magnetic field are provided in a detection space above the sample. The electromagnetic fields cause the secondary electrons emitted from the sample to travel in a spiral course in the detection space before being captured by the anode of the detector. The long trajectory of the secondary electron in the detection space increases gas ionization and therefore increases the detector gain. Another method for improving the detector gain is introduced in U.S. Pat. No. 7,541,580. Therein, the detection space extends above a pressure limiting aperture to further increase gas ionization. However, the signal to noise ratio of the SEM image remains low due to electron beam scattering in the gaseous environment.

SUMMARY

In one embodiment, a method for imaging a sample comprises providing a gas in a detection space; providing a magnetic field in the detection space; irradiating the sample with a charged particle beam while providing a plasma in the detection space; detecting charged particles emitted from the sample into the detection space responsive to the irradiation; and forming an image based on the detected charged particles. By providing plasma into the detection space, the gaseous secondary electron detector can perform imaging at lower chamber pressure. Image quality is improved by the increased detector gain and reduced beam scattering.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the drawings.

DETAILED DESCRIPTION OF EMBODIMENTS

Figure 1:
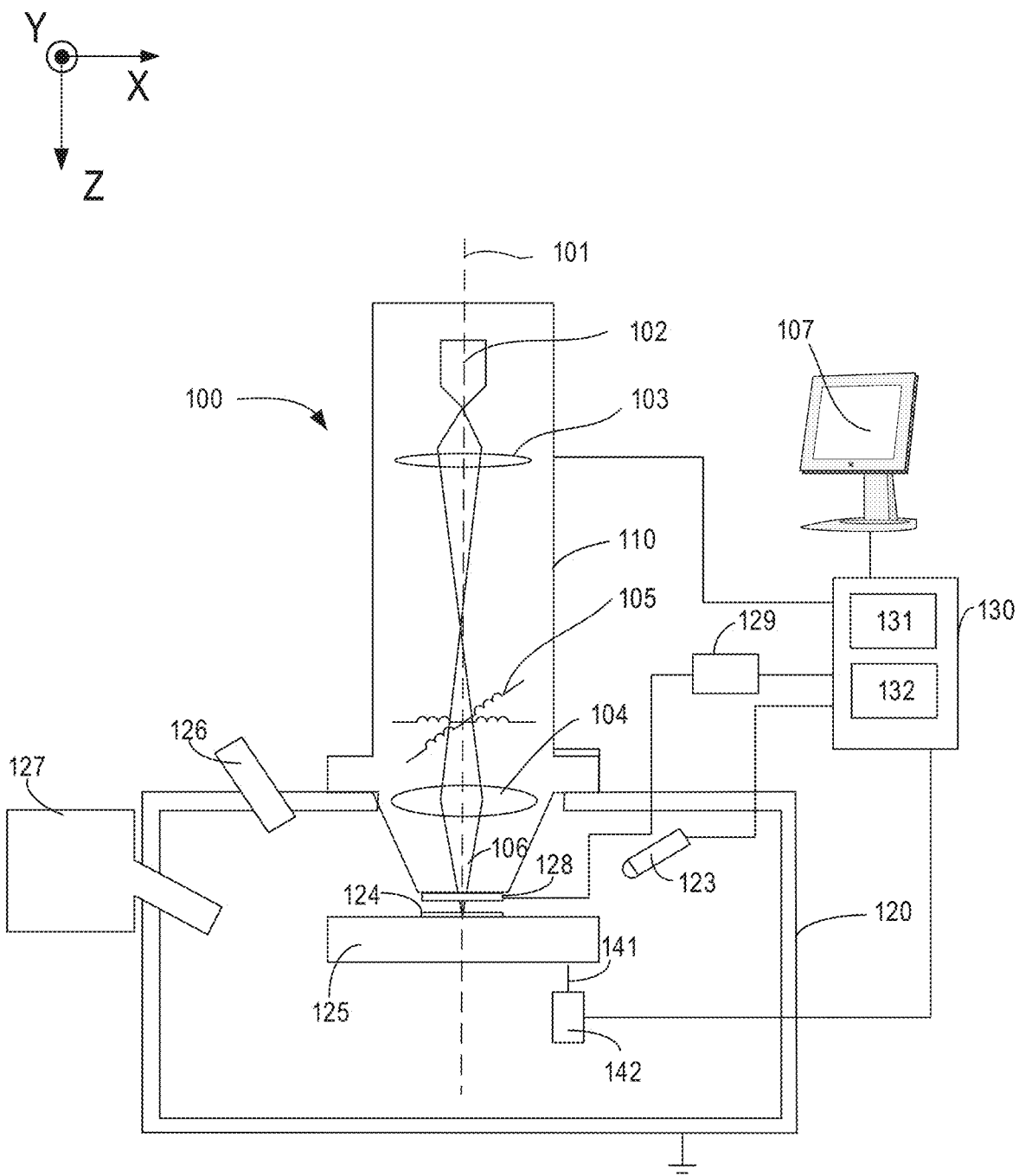
FIG. 1 is a schematic depiction of a charged particle microscopy system for low vacuum imaging.

The following description relates to systems and methods for performing charged particle microscopy in a gaseous environment using a low vacuum microscope, such as a low vacuum scanning electron microscope (SEM) of FIG. 1. The sample positioned in a sample chamber is irradiated with a charged particle beam formed in a particle-optical column coupled to the sample chamber. The sample chamber has a vacuum lower than the vacuum in the particle-optical column. For example, the column, especially the electron source, is pumped to a high vacuum, such as higher than $10^{-5}$ torr, for generating the electron beam. The sample chamber may be pumped to 0.01 torr to 50 torr. The difference in vacuum from the sample chamber to the electron source within the column may be achieved via different stages of pumping and multiple pressure limiting apertures (PLAs) positioned along the column.

Figure 2:
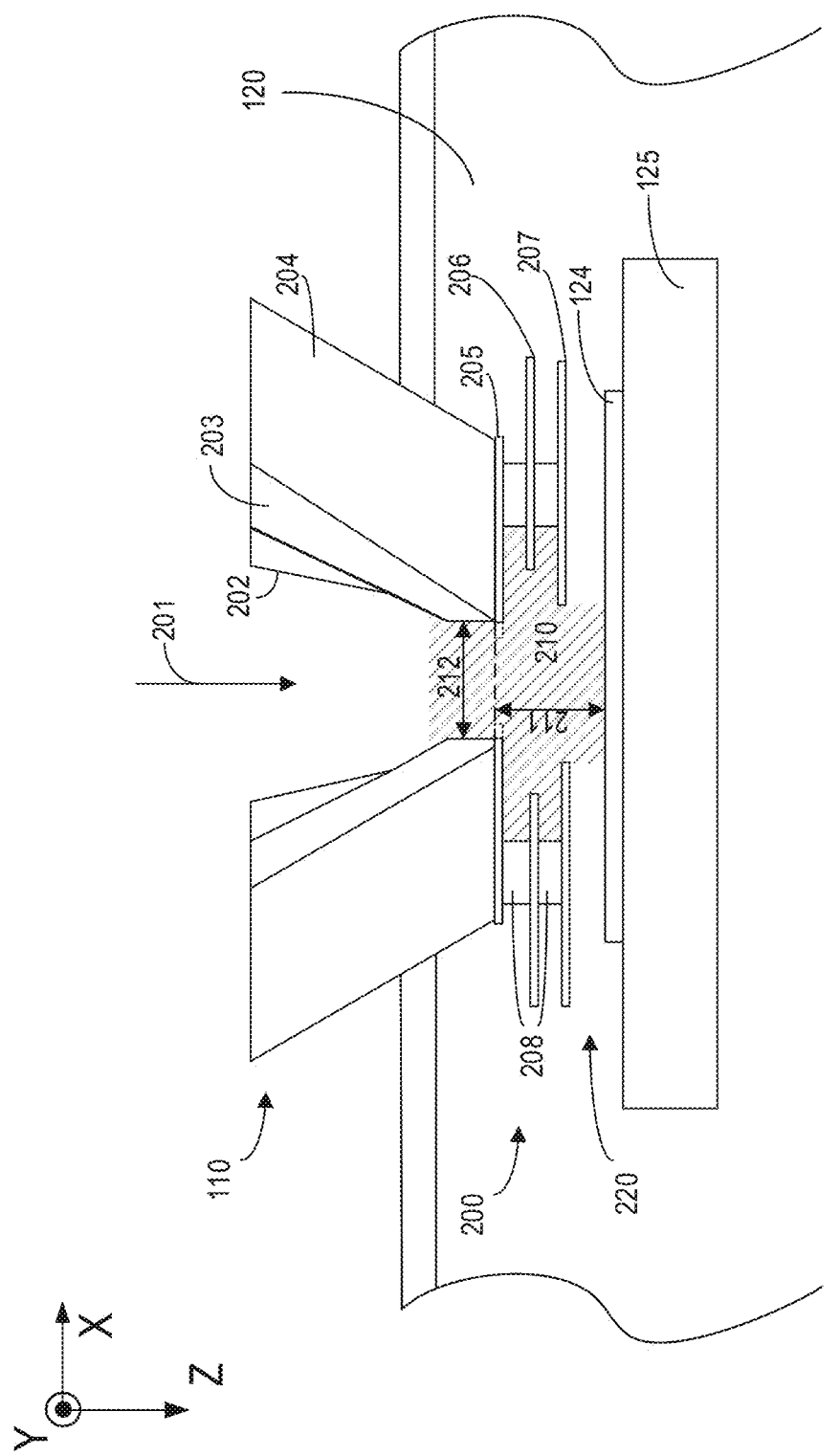
FIG. 2 shows a gaseous secondary electron detector (GSED) in the microscopy system of FIG. 1.
Figure 3:
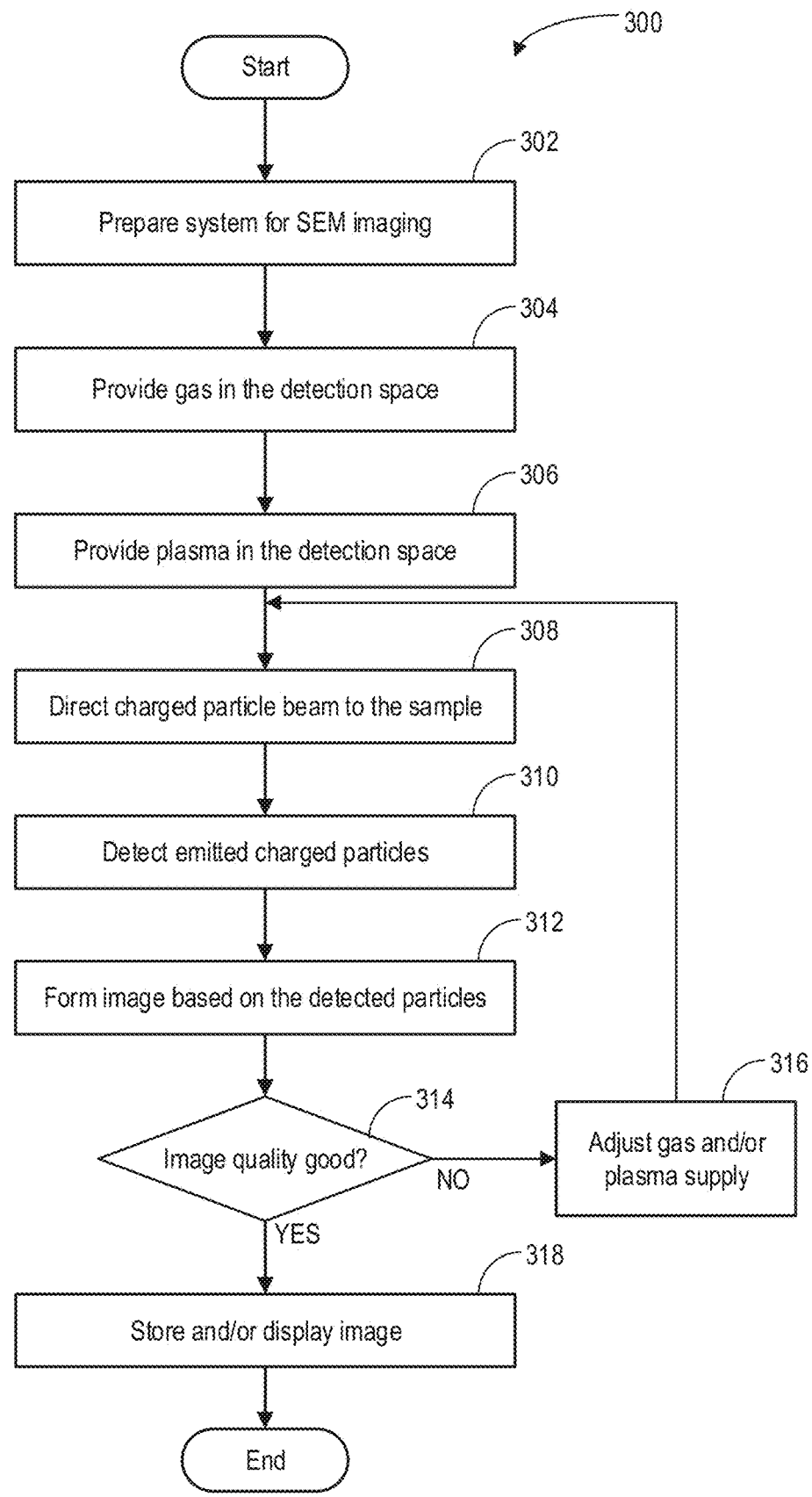
FIG. 3 is a flow diagram for performing plasma assisted low vacuum imaging.

The low vacuum microscopy system may be operated according to the method of FIG. 3 for plasma assisted low vacuum microscopy. During plasma assisted low vacuum microscopy, a charged particle beam irradiates a sample. Responsive to the radiation, charged particles emitted from the sample travel to a detection space, and are detected by a detector positioned between the particle-optical column and the sample. A gas and a plasma are provided in the detection space during sample irradiation and charged particle detection. In some examples, the detector may be a gaseous secondary electron detector (GSED) shown in FIG. 2 for detecting secondary electrons emitted from the sample. The detection space may be above the sample surface and extend into the column. The sample in the sample chamber is immersed in a magnetic field. The magnetic field may be generated by a magnetic immersion lens positioned within the particle-optical column. The magnetic field may alternatively be generated by a source different from the lens in the column. For example, the magnetic field may be generated by the detector. The emitted charged particles are amplified as they travel in the detection space by colliding with the gas molecules and generating more charged particles (that is, cascade amplification). The trajectory of the charged particles in the detection space is defined by the magnetic field and an electric field generated by the detector.

Figure 4B:
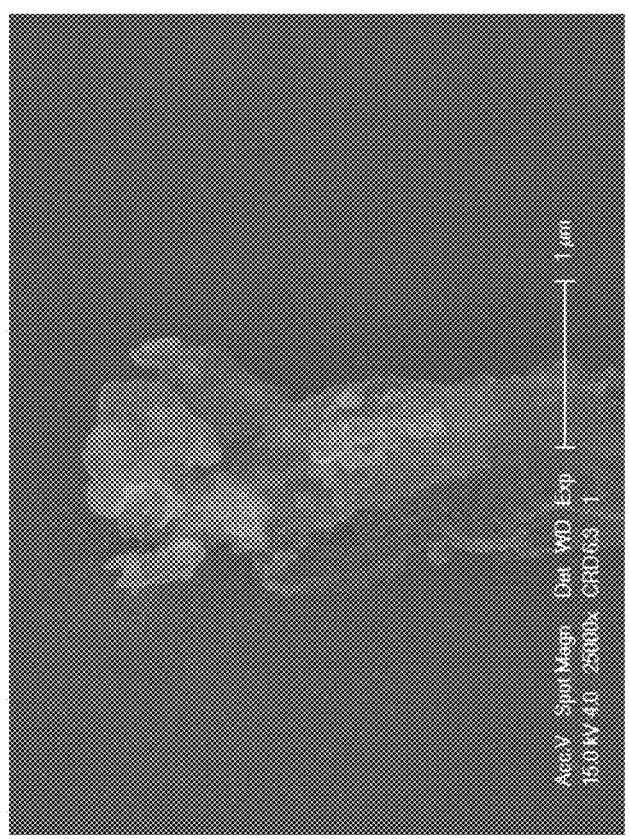
FIGS. 4A and 4B show scanning electron microscopy (SEM) images acquired with and without plasma in the sample chamber, respectively.
Figure 4A:
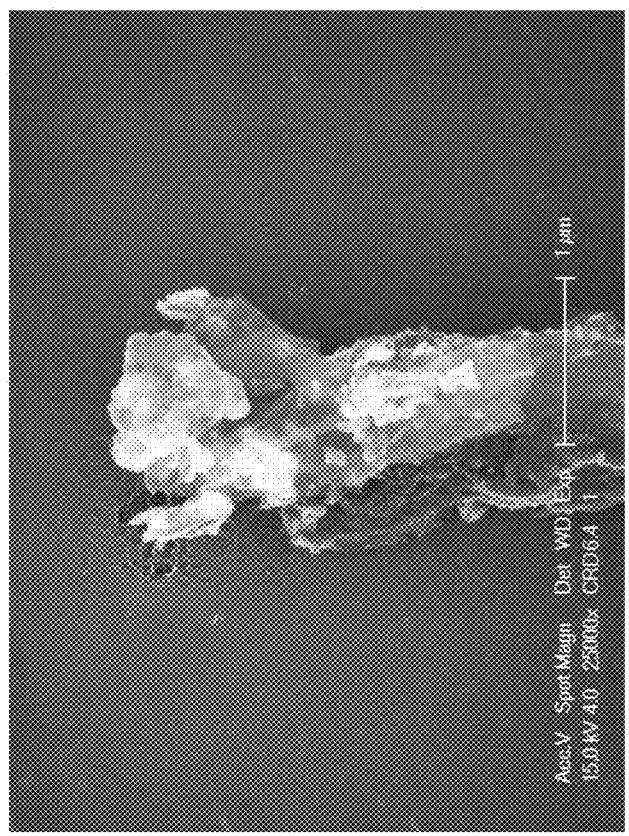
Figure 5:
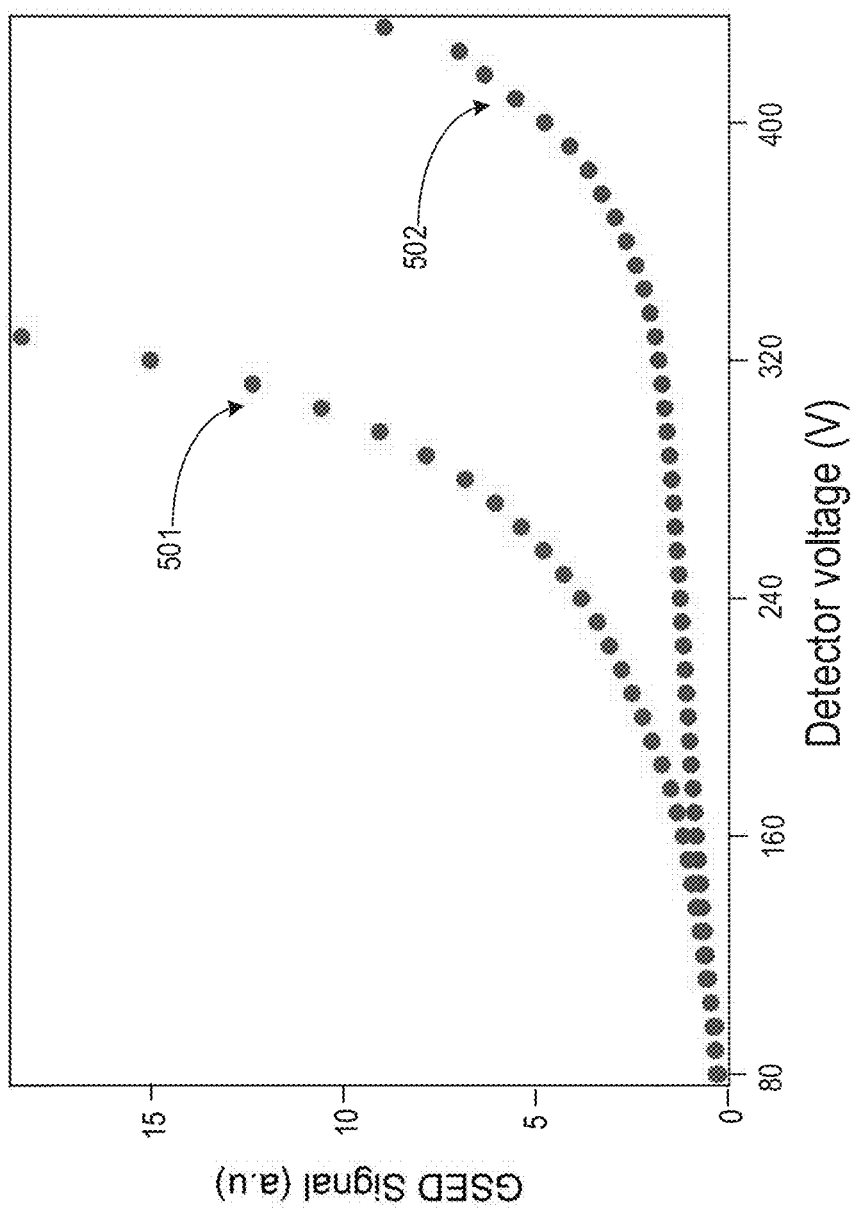
FIG. 5 is a plot showing the effect of plasma on GSED output.
Figure 7:
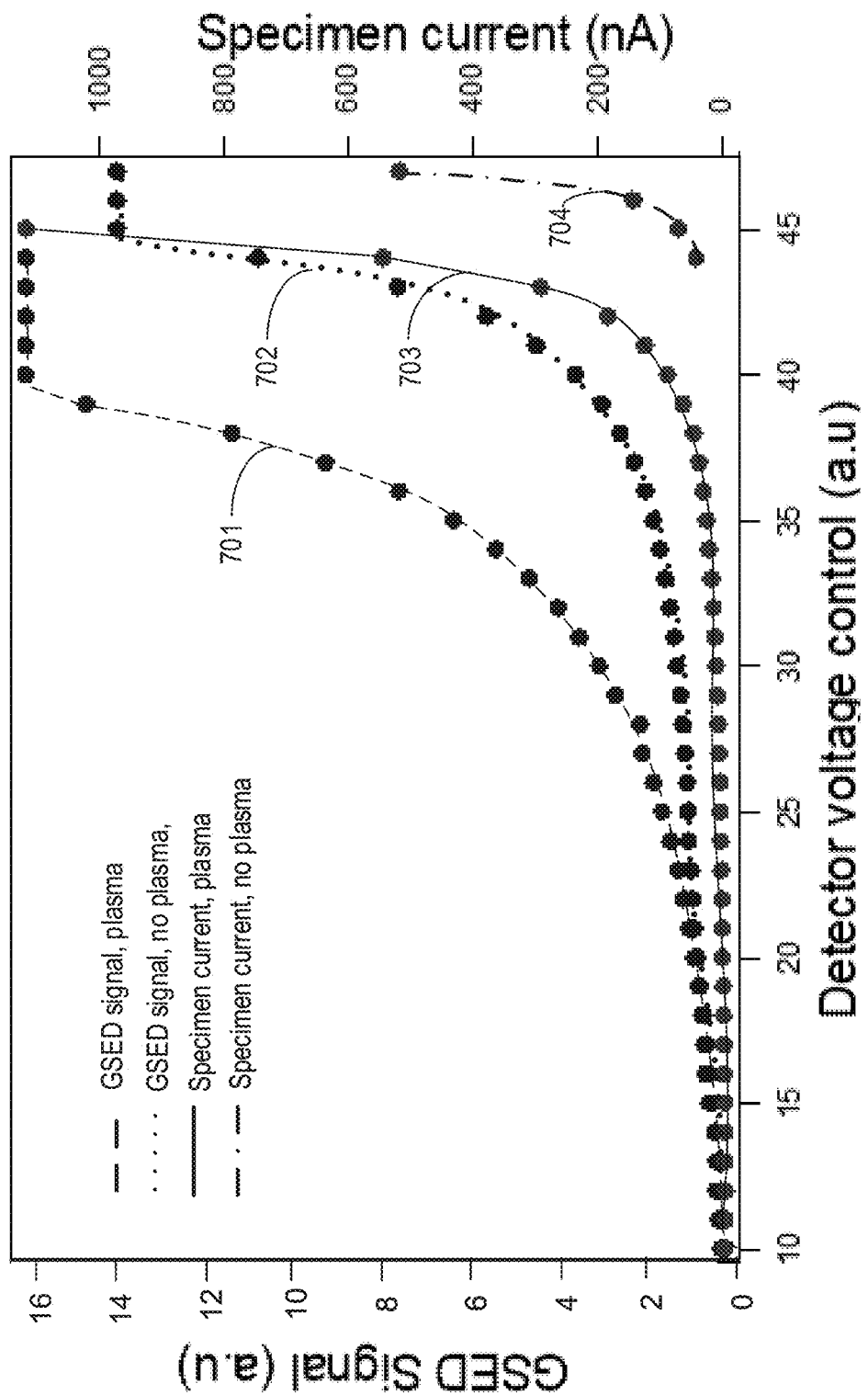
FIG. 7 is a plot showing the effect of plasma on GSED output and the specimen current.

By providing the plasma to the detection space, SEM images with improved signal to noise ratio (SNR) and improved contrast may be obtained, as shown in FIGS. 4A-4B. These improvements are greatest at low pressures, and the invention therefore enables lower vacuum microscope operation than conventional low vacuum SEM imaging. The conventional low vacuum SEM performs imaging at a sample chamber vacuum between 0.1 torr and 50 torr and more typically between 1 torr and 10 torr. Plasma assisted low vacuum SEM, on the other hand, enables operation at sample chamber pressures as low as 0.01 torr, as shown in FIGS. 8A-8D and FIG. 9. The plasma increases the maximum gain of the GSED detector, as shown in FIG. 5 and FIG. 7. The introduced plasma increases the charge mitigation effect of low vacuum SEM at lower gas pressures, which enables high quality SEM imaging of nonconductive samples at higher vacuum levels. The reduced gas pressure in the sample chamber also reduces scattering of the incident beam within the particle-optical column and within the detection space, which increases the SNR of the image. Additionally, with higher sample chamber vacuum, the aperture of the PLA between the particle-optical column and the sample chamber (the last PLA in the particle-optical column) may be large. In some embodiments, no PLA between the column and the sample chamber is needed. The increased PLA aperture, or the absence of the last PLA in the column, can increase the field of view (FOV) for SEM imaging, especially the FOV for low magnification imaging.

Figure 6A:
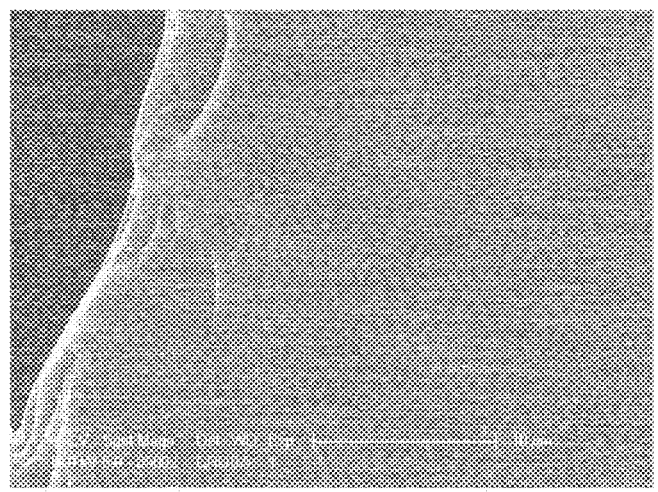
FIGS. 6A, 6B, and 6C are SEM images acquired with different partial pressure of hydrogen ion.
Figure 6B:
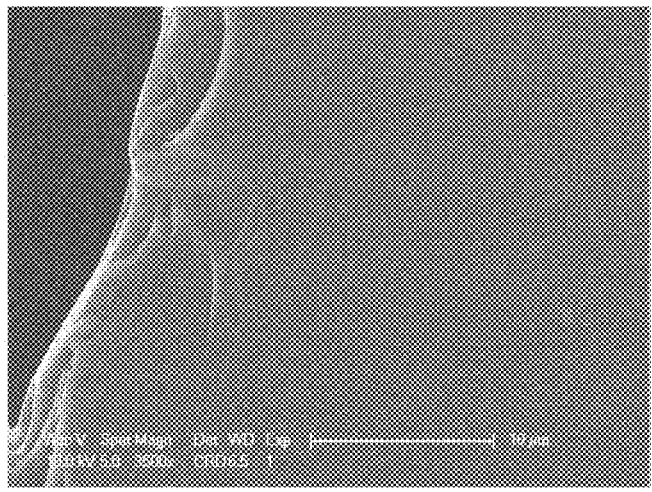
Figure 6C:
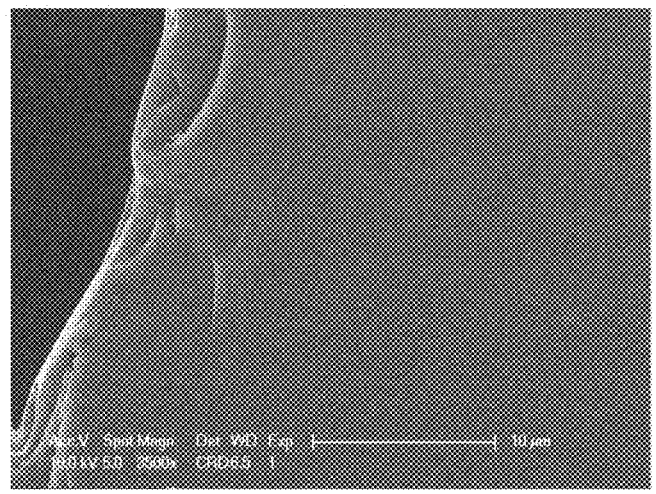

The plasma may be introduced to the sample chamber by ionizing the gas flowed to the sample chamber, or by a plasma source. For example, the gas flowed to the sample chamber may be one or more of water, atmospheric gas, and inert gas as such argon or helium. Plasma with ions of small molecular weight may further reduce noise in the SEM images, as shown in FIGS. 6A-6C.

Turning to FIG. 1, a schematic depiction of the charged-particle microscope 100 is shown. The charged-particle microscope is a non-transmission-type microscope, such as a SEM. Microscope 100 includes a particle-optical column 110 mounted on a sample chamber 120. The particle-optical column 110 generates an electron beam along primary axis 110. Within the particle-optical column 110, electrons generated by electron source 102 are modified by the compound lens system 103 before being focused onto sample 124 by lens system 104. The incident beam 106 may scan over sample 124 by operating the scan coils 105. Multiple pumps (not shown) are coupled to column 110 to provide differential pumping along the beam path within the column. For example, the vacuum is lower closer to the sample chamber and higher closer to the electron source 102. The lens system 104 may include a magnetic immersion lens for focusing the electron beam onto the sample. The magnetic immersion lens may be the last lens of column 110. Sample 124 is immersed in the magnetic field created by the magnetic immersion lens. A pressure limiting aperture (PLA) may optionally be integrated to the last lens of the optical column (such as the magnetic immersion lens) before the electron beam irradiates the sample. The PLA limits the amount of gas from the sample chamber entering the column, therefore maintains the higher vacuum in the column comparing to the sample chamber.

Sample 124 is held by sample stage 125 in the sample chamber 120. Gas source 127 is coupled to the sample chamber for providing one or more gas species into the sample chamber. Plasma source 126 is coupled to the sample chamber for providing one or more species of plasma into the sample chamber. Plasma source 126 may be a plasma cleaner. The plasma supplied to the sample chamber may be generated by ionizing the same gas provided by the gas source 127, via the plasma cleaner.

Microscope 100 includes multiple detectors for detecting emissions from sample 124 in response to the incidence of electrons generated from electron source 102. Detector 123 may be a combined scintillator/photomultiplier or EDS (Energy-Dispersive X-Ray Spectroscopy) module. Detector 128 is positioned between the column 110 and sample 124 for detecting backscattered or secondary electrons emitted from the sample. Detector 128 may be a segmented electron detector with a plurality of independent detection segments (e.g. quadrants) disposed about a central aperture allowing passage of the electron beam. Detector 128 may be a GSED that detects secondary electrons travelling into the detection space above the sample. Detailed configuration of an example GSED detector is shown in FIG. 2. Signals received from detector 128 are amplified by amplifier 129 and transferred to controller 130 to form a sample image. The sample stage 125 may be grounded with the sample chamber 120 by connection 141. Specimen current may be measured by picoammeter 142 coupled to sample stage via connection 141. Picoammeter 142 sends measured specimen current to controller 130 while the sample is scanned with the charged particle beam. A sample image may be generated based on the specimen current.

Controller 130 comprises a processor 131 and a non-transitory memory 132 for storing instructions. The controller is coupled to an input/out device 107 for receiving operator instruction and/or outputting information including images, measurements, and operating parameters. By executing the instructions stored in memory 132 with processor 131, controller 130 operates various components of the microscope to image or process the sample. For example, the electron beam energy may be adjusted by adjusting the power supply to the source 102. Imaging parameters including magnification, beam position, imaging region, and beam dwelt time, etc. may be adjusted by adjusting one or more of the lens systems 103, 104, and scan coils 105. The controller also forms images of the sample based on signals received from various detectors (123, 128, and 142) in the microscope. The controller may store the images in memory 132 and/or output the images via the input/output device 107.

Though an SEM system is described by way of example, it should be understood that the microscope may be configured to image the sample in the transmission mode, such as in a transmission electron microscopy (TEM) system. For example, the GSED may be used for acquiring scattered electrons from a thin sample in the transmission mode at the presence of the plasma. In other examples, the plasma assisted imaging may be performed in a dual beam microscopy system. The present discussion of SEM imaging is provided merely as an example of one suitable imaging modality.

FIG. 2 shows an example configuration of GSED 200 in the microscopy system (such as microscope 100 of FIG. 1) for acquiring the backscattered or secondary electrons emitted from the sample. A part of column 110 that couples to sample chamber 120 is shown in FIG. 2. Electron beam 201 travels along column 110 and irradiates sample 124 positioned on sample stage 125. Electron lens 202 is a magnetic immersion lens, which provides the magnetic field in detection space 210. The magnetic field strength may be 0.01-0.1 Tesla. Electron lens 202 is the last lens of column 110 that the electron beam travels through before impinging the sample 124. Sample 124 is immersed in the magnetic field created by the last lens. Working distance 211 is defined by the distance between column 110 and the sample surface. The working distance is preferably small in low vacuum SEM for reduced incident beam scattering.

Electrode 205 is attached to the pole piece support 204 that supports the pole piece 203. In one example, as shown by the dashed line, electrode 205 may have an opening smaller than the opening 212 of the distal end of the column that couples with the sample chamber. By having a smaller opening, electrode 205 serves as a PLA for preventing gas in the sample chamber from entering the column, and maintaining high vacuum within the column. In another example, there is no PLA at the end of the column which is coupled to the sample chamber. The distal end of the column has the same vacuum level as the sample chamber. For example, electrode 205 may have the same opening as the distal end of the column 110, as shown by the solid line. Alternatively, electrode 205 may be omitted. Due to the lower gas pressure in the plasma assisted low vacuum SEM comparing to conventional low vacuum SEM, high quality image can be obtained even when the distal end of the column and the sample chamber have the same vacuum level.

The GSED 200 is positioned between the column 110 and sample 124. The GSED includes an anode 206 and an ion trap 207 separated from each other, and from electrode 205 by insulating spacers 208. Electrons, such as secondary electrons, emitted from the sample responsive to charged particle irradiation are amplified in a detection space before being detected by anode 206. The detection space is defined by the location and the structure of the GSED. The detection space is confined by the central aperture of the GSED. In one example, if a PLA is positioned between the column and the sample chamber, the detection space extends from the surface of sample 124 to the PLA. In another example, due to the increased PLA opening between column 110 and detector 200 in plasma assisted low vacuum microscopy, the detection space (shaded area 210) extends from the sample surface into the column, opposite to the direction of the electron beam 201. In this configuration, a PLA may optionally be placed upstream of the opening 212. The height (in z-direction) of the detection space 210 may be greater than the working distance 211. The height of the detection space may also be determined by the provided magnetic field and electric field. The magnetic field may be provided by the magnetic immersion lens or the GSED. The electric field is provided by the GSED. Increased volume of the detection space increases the cascade amplification of secondary electrons, thus increases the received signal strength. Gas and plasma may be delivered to the detection space 210 via gap 220 between detector 200 and sample stage 125. The detection area may have a vacuum level between 0.01 torr and 10 torr.

In one example, electrode 205 is electrically isolated from the pole piece 203 and maintained at a potential of between −1000 V to 2000 V, with ground potential being a typical potential. The anode 206 is biased within a range of 0 volts to 2000 volts, with a potential of about 400 V being the most preferred. The ion trap 207 is biased within a range of −1000 volts to 2000 volts, with ground potential being the most preferred. The sample stage 125 is biased within a range of −1000 volts to 1000 volts, with a ground potential being the most preferred.

In another example, sample images may be formed based on ions or photons generated due to the gas cascade amplification in the detection area. The ions or photons may be detected by one or more detectors different from detector 200.

FIG. 3 shows method 300 for plasma assisted low vacuum SEM imaging. The SEM image is formed based on secondary electrons acquired within a detection space defined by the detector (such as the GSED 200 of FIG. 2). A gas and a plasma are simultaneously provided to the detection space during the secondary electron acquisition. FIG. 3 may be implemented by executing the instructions saved in the non-transitory memory of a controller (such as controller 130 of FIG. 1).

At 302, the microscope is prepared for SEM imaging. The preparation may include loading the sample into the sample chamber and pumping various parts of the microscope to proper vacuum levels. The step may further include setting operating parameters of the microscope. The operating parameters may include column parameters such as beam energy, magnification, and field of view. The operating parameters may also include sample chamber parameters such as gas type, gas pressure, plasma type and plasma pressure. The chamber parameters may be determined based on the type of the sample. For example, the gas should not react with the sample. The gas may include one or more gas species. For example, the gas may be a mixture of Ar and $H_2$. In another example, the gas may be air. The plasma may include one or more ion types. In one example, the plasma includes at least one gas molecule species with a molar weight less than 5. In another example, the molar weight of at least one gas molecule species is one.

At 304, the gas is provided in the detection space. In one example, the gas may be delivered into the sample chamber. The gas flows into the detection space via the gap between the GSED detector and the sample stage. In another example, the gas is directly delivered into the detection space via a nozzle coupled to a gas source. The gas pressure in the detection space may be 0.005 to 0.5 torr. In some examples, the gas pressure is under 0.05 torr.

At 306, a plasma is provided to the detection space. In one example, the plasma may be generated by ionizing the gas supplied to the sample chamber at 304. The gas may be ionized by a plasma generator coupled to the sample chamber. The power supplied to the plasma generator may depend on the gas type. For example, the power supplied to the plasma cleaner is the minimum power level to maintain the plasma. The plasma generated by the plasma generator in the sample chamber may travel into the detection space via the gap between the GSED detector and the sample stage. In another example, the plasma may be supplied to the detection space via a nozzle coupled to a plasma generator. The plasma may include different chemical element from the gas.

At 308, the charged particle beam, such as an electron beam, is directed to the sample by operating the charged particle source and the lenses in the particle-optical column. The charged particle beam irradiates the sample. The charged particle beam may scan a region of interest of the sample surface according to a predetermined pattern.

At 310, charged particles emitted from the sample responsive to the irradiation are detected by the GSED. For example, the emitted secondary electrons travelling under the influence of the magnetic field and the electric field in the detection space are cascade amplified by colliding with gas molecules and generating more electrons. The electrons in the detection space are collected by the anode of the GSED. The plasma in the detection space may suppress gas breakdown and increase the gain of the GSED. The emitted secondary electrons are detected while the sample is scanned with the electron beam.

At 312, after the charged particle beam scans over a region of interest (ROI) over the sample surface, an SEM image of the ROI may be formed based on detector output.

At 314, quality of the image formed at 312 is assessed. The image quality may include one or more of image resolution, SNR and contrast, etc. The image quality may be assessed by the operator. Alternatively, the image quality may be assessed automatically by the controller. If the image quality is good, the image is stored or displayed at 318. Otherwise, the gas or plasma supply may be adjusted in 316 to further improve image quality. For example, light weight ions may be introduced to reduce noise responsive to high noise level in the formed image. In another example, the RF power to the plasma generator may be reduced responsive to high noise level in the formed image. By reducing the RF power to the plasma generator, the amount of the chamber gas which is ionized decreases. In yet another example, the sample chamber vacuum may be lowered to increase SNR. The sample chamber vacuum may be lowered by decreasing the partial pressure of gas and/or the partial pressure of plasma.

In this way, SEM images are acquired while providing a gas and a plasma to the detection space. Neither the gas nor the plasma reacts with the sample. By providing the plasma to the detection space during low vacuum SEM imaging, sample chamber pressure may be reduced. The reduced sample chamber pressure decreases scattering of incident beam in the detection space. Moreover, due to the reduced sample chamber pressure, a pressure limiting aperture between the column and the sample chamber may have a larger opening or be eliminated completely.

FIGS. 4A and 4B show SEM images taken under the same beam parameters with and without plasma in the detection space, respectively. The SEM images are taken with a GSED and using a column including a magnetic immersing lens. Water is provided in the sample chamber at the pressure of 0.126 torr. During imaging, plasma in the sample chamber is generated by ionizing the provided water with a minimum required RF power for maintaining the plasma. The detector voltages (voltage supplied to anode of the detector) for FIGS. 4A and 4B are 400V and 326V, respectively. With lower detector voltage, the SNR and contrast are higher for the SEM image (FIG. 4B) acquired in plasma comparing to the SEM image (FIG. 4A) acquired without plasma.

Notably, the SNR and contrast are enhanced by the plasma only when both the magnetic field and the electric field are provided in the detection space of the GSED. For example, SEM image quality does not change responsive to plasma introduction if the image is acquired using a GSED in the non-magnetic immersion mode where the operating pressure must be relatively high and gas amplification is not limited by the number of collisions between emitted electrons and gas molecule between the sample and the detector.

FIG. 5 shows GSED output at various detector voltages. The two curves, 501 and 502, are obtained with and without plasma in the detection space, respectively. The data is generated by imaging featureless silicon sample at the same level of sample chamber vacuum of 0.4 torr. Pure Ar is provided into the sample chamber. Plasma in the sample chamber is generated by ionizing the Ar with a plasma generator. At each detector voltage set to the GSED detector, the detector output signal is recorded using the system shown in FIG. 1. For SEM imaging without plasma, the measurement is performed till the detector voltage causes the gas breakdown. For SEM imaging with plasma, the measurement is performed till the detector voltage causes saturation in detector output.

For both data acquired with and without plasma, signal amplitude increases with increased detector voltage. At a specific detector voltage, the amplitude of the signal acquired with plasma is higher than the signal amplitude without plasma. The difference between the signal amplitudes with and without plasma increases with increased detector voltage. The increased signal strength at the presence of plasma indicates that the detector gain increases significantly with plasma in the detection space. The increased detector gain relates to lower ionization thresholds and larger ionization cross-sections of gas molecules that are radicalized (i.e. excited) when the plasma is on.

FIGS. 6A-6C show the effect of $H_2$ in the gaseous environment for plasma assisted low vacuum SEM imaging. A silicon sample is imaged in the microscopy system of FIG. 1. A mixture of Ar and $H_2$ is supplied to the sample chamber. Plasma is generated in the sample chamber by igniting the supplied gas mixture. The partial pressure of Ar in the sample chamber is 0.4 torr. The partial pressure of $H_2$ in the sample chamber is 0.005 torr, 0.01 torr, and 0.011 torr for FIGS. 6A, 6B and 6C, respectively. The SEM images are acquired with the same operating parameters except for different amount (partial pressure) of $H_2$. By increasing the amount of $H_2$ in the sample chamber, the image noise decreases from FIG. 6A to FIG. 6C. The decreased image noise with increased $H_2$ may be due to contribution of light weight ions into the detection space. These light ions may respond faster to the fluctuations in the electromagnetic fields, thus reducing the noise by increasing the electromagnetic shielding of the detector. Instead of hydrogen ion, other types of light weight ions may be supplied to the sample chamber. The plasma may include multiple types of ions, wherein at least one ion type is with molar weight less than 5. In one example, the gas provided to the sample chamber is a mixture of multiple gas species, with at least one gas species with molar weight less than 5. The plasma may be generated by ionizing a part of the gas in the sample chamber. In another example, the gas provided to the sample chamber may be ionized to generate plasma with an ion of molar weight less than 5. The plasma may contain hydrogen. The gas may include $H_2$ and/or water. The gas may include He.

FIG. 7 shows GSED output and specimen current measured with and without plasma at various detector voltage value. The detector voltage increases from left to right in the x-axis. Plot 701 and 702 are signal amplitudes from GSED output with and without plasma, respectively. Plot 703 and 704 are specimen current measured with and without plasma, respectively. A mixture of Ar and $H_2$ are provided to the sample chamber. The partial pressure of Ar is 0.22 torr, and the partial pressure of $H_2$ is 0.02 torr.

Similar to FIG. 5, GSED signal amplitude is calculated, for example, based on pixel values of SEM images. The GSED signal increases with increased detector voltage, and with the presence of plasma. The maximum signal amplitude output from the GSED is higher in presence of plasma. That is, the maximum of plot 701 is higher than the maximum of plot 702.

While scanning the sample with the charged particle beam, specimen current may be recorded and used for generating a sample image. The specimen current is the current flow caused by ions in the detection space travelling towards the sample. The specimen current is measured directly with a separate picoammeter connected to the stage.

The specimen current (plot 703 and 704) increase with increased detector voltage. At the same detector voltage, the specimen current with plasma (plot 703) is higher than the specimen current without plasma (plot 704). As such, plasma can also increase the SNR of sample image formed with specimen current.

Figure 8A:
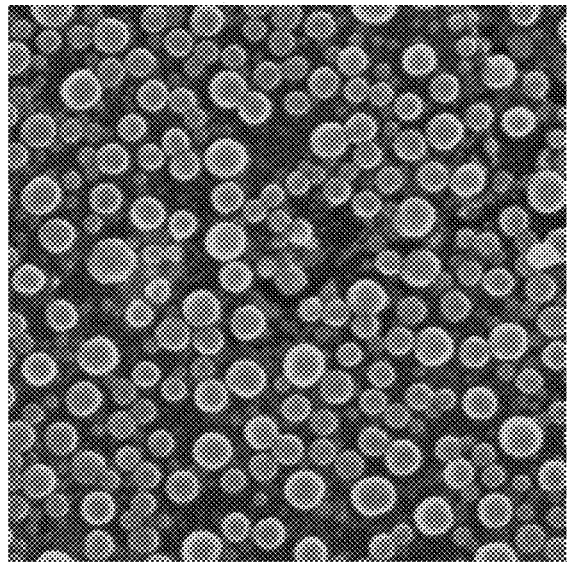
FIGS. 8A and 8B are SEM images acquired with and without plasma in a sample chamber with low chamber pressure.
Figure 8B:
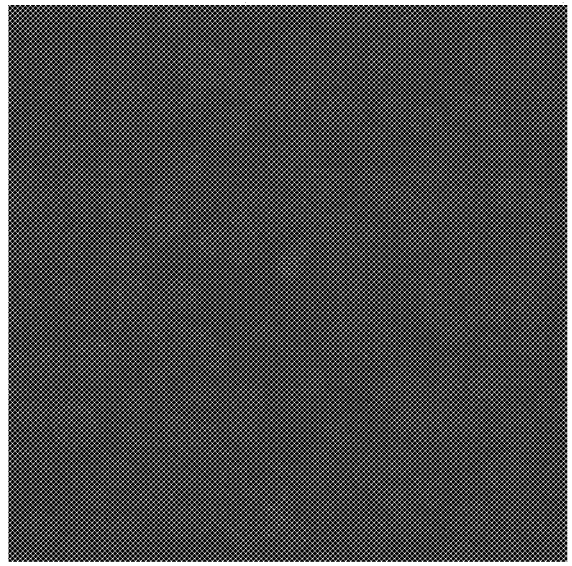
Figure 8C:
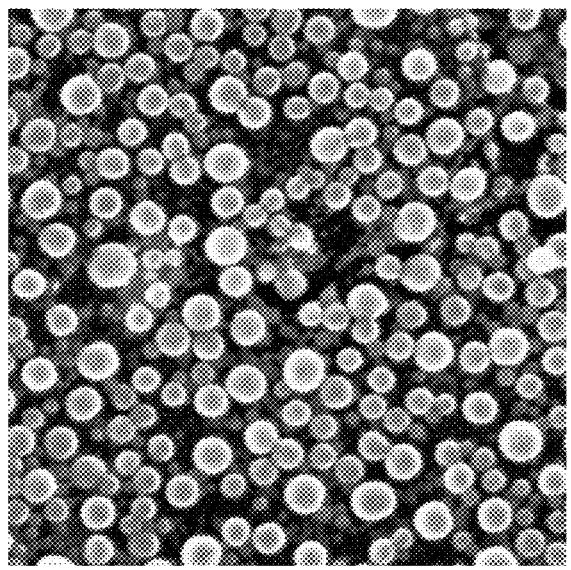
FIGS. 8C and 8D are normalized SEM images of FIG. 8A and FIG. 8B, respectively.
Figure 8D:
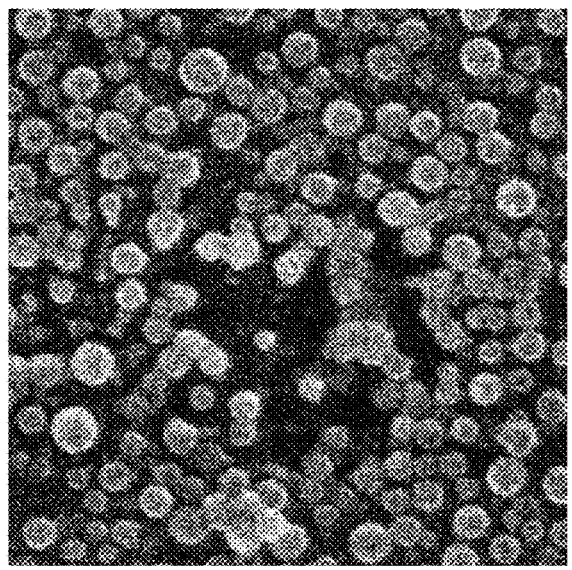

FIG. 8A-8D are SEM images of tin balls acquired at the maximum GSED gain at a chamber pressure of 0.014 torr. FIG. 8A is acquired with plasma. The plasma is provided by ionizing $H_2O$ provided in the sample chamber. The pressure of $H_2O$ is 0.014 torr. FIG. 8B is acquired without plasma. FIGS. 8C and 8D are digitally normalized images of FIG. 8A and FIG. 8B, respectively. The image normalization used is histogram equalization. Image contrast and SNR of FIG. 8A and FIG. 8C are significantly higher than the contrast and SNR of FIG. 8B and FIG. 8D.

Figure 9:
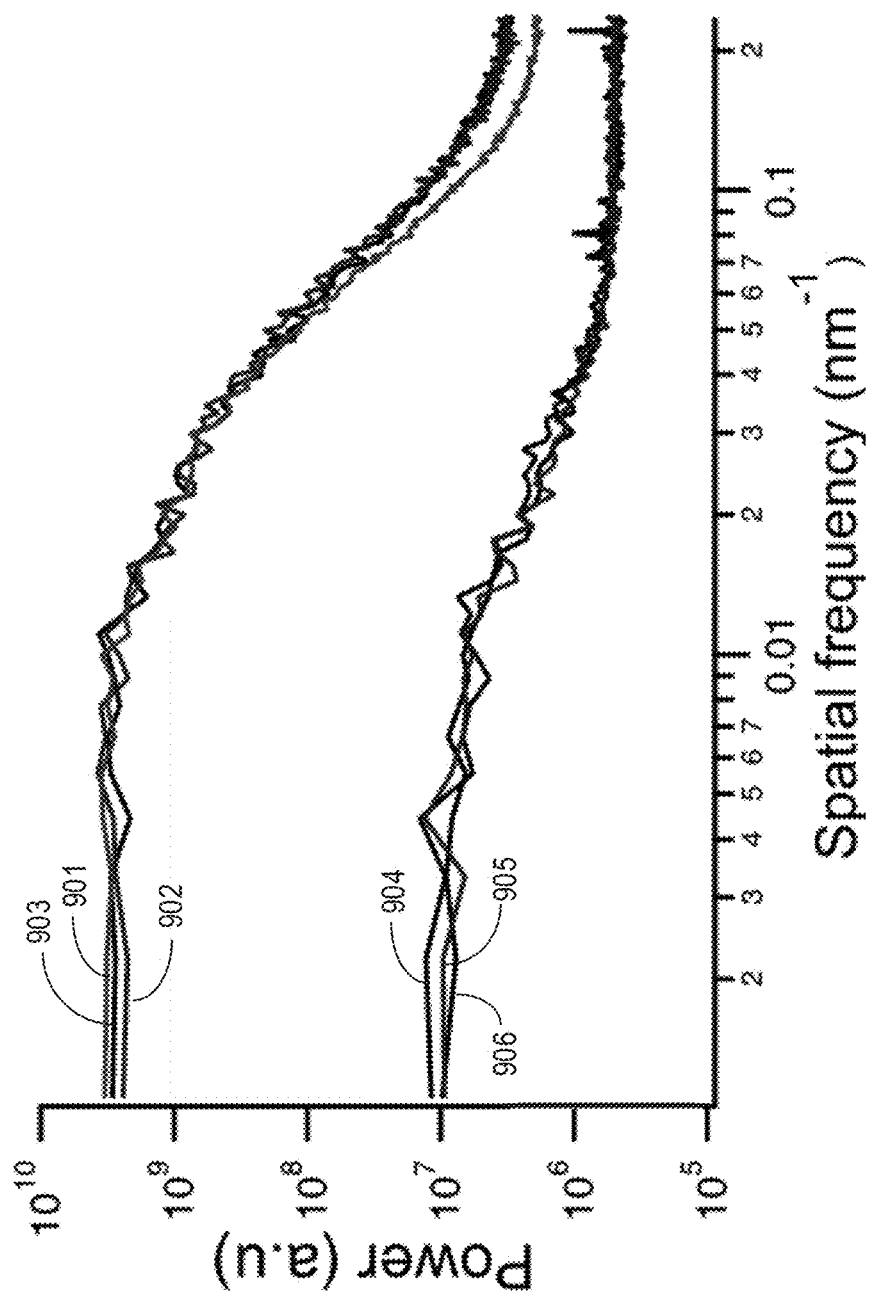
FIG. 9 are power spectra obtained from the images in FIGS. 8A and 8B.

FIG. 9 are one dimensional power spectra in different spatial directions of FIGS. 8A and 8B. The y-axis is the signal power. The x-axis is the spatial frequency. Plots 901, 902, and 903, are the power spectra of FIG. 8A. Plots 904, 905, and 906, are the power spectra of FIG. 8B. The power spectra show that the plasma-induced improvement in SEM imaging signal is present across the entire frequency spectrum.

FIGS. 8A-8D and FIG. 9 indicate that plasma can enhance a quality of image acquired with the GSED at very low chamber pressure, such as chamber pressure lower than 0.05 torr. Plasma assisted low vacuum SEM can achieve high SNR and high contrast at very low pressure that cannot be obtained by optimizing the GSED alone. Plasma assisted low vacuum SEM can improve imaging resolution as a lower beam current can be used for SEM imaging.

The technical effect of providing a magnetic field and an electric field to the detection space is to increase the cascade amplification of the secondary electrons emitted from the sample. The technical effect of providing plasma to the sample chamber during low vacuum SEM imaging is to maintain high detector gain with lower gas pressure. Image resolution may be improved as lower beam current can be used to obtain a given SNR and beam scattering is reduced due to increased sample chamber vacuum.

In one embodiment, a method for imaging the sample includes providing a gas in a detection space; providing a magnetic field in the detection space; irradiating the sample with a charged particle beam while providing a plasma in the detection space; detecting charged particles emitted from the sample into the detection space responsive to the irradiation; and forming an image based on the detected charged particles. In a first example of the method, the gas is a mixture of multiple gas species. A second example of the method optionally includes the first example and further includes, wherein the plasma includes at least one gas molecule species with a molar weight less than 5. A third example of the method optionally includes one or more of the first and second examples, and further includes, wherein the plasma includes hydrogen. A fourth example of the method optionally includes one or more of the first and third examples, and further includes, wherein the plasma is provided by ionizing at least one species of the gas provided in the detection space. A fifth example of the method optionally includes one or more of the first and fourth examples, and further includes, wherein the sample is immersed in the magnetic field. A sixth example of the method optionally includes one or more of the first and fifth examples, and further includes, wherein the charged particles emitted from the sample are detected by a detector, and the detection space is defined by a position and a structure of the detector. A seventh example of the method optionally includes one or more of the first and sixth examples, and further includes, wherein the sample is positioned within a sample chamber with a pressure less than 0.05 torr. An eighth example of the method optionally includes one or more of the first and seventh examples, and further includes, wherein the charged particle beam is an electron beam, and the detected charged particles are secondary electrons. A ninth example of the method optionally includes one or more of the first and eighth examples, and further includes adjusting an amount of the gas and an amount of the plasma provided to the detection space based on the formed image.

In one embodiment, a method for imaging a sample, comprises providing a magnetic field in a detection space; scanning the sample with an electron beam while providing a gas and a plasma in the detection space; detecting charged particles emitted from the sample; and forming a sample image based on the detected charged particles. In a first example of the method, the electron beam is directed to the sample through an optical column, and a pressure in the detection space is the same as a pressure in a part of the optical column. A second example of the method optionally includes the first example and further includes recording a specimen current while scanning the sample; and forming a second sample image based on the recorded specimen current.

In one embodiment, a system for imaging a sample, comprises a sample chamber; a sample stage positioned in the sample chamber for holding the sample; a column coupled to the sample chamber for generating a charged particle beam towards the sample stage; a gas source coupled to the sample chamber; a detector for detecting charged particles in a detection space; and a controller with instructions stored in a non-transitory memory, the controller is configured to: provide a gas to the detection space with the gas source; provide a magnetic field in the detection space; irradiate the sample with the charged particle beam while providing a plasma in the detection space; detect, via the detector, charged particles emitted from the sample into the detection space responsive to the irradiation; and form an image based on the detected charged particles. In a first example of the system, the system further comprises a plasma generator coupled to the sample chamber, and wherein providing the plasma in the detection space includes ionizing at least one gas species of the provided gas with the plasma generator. A second example of the system optionally includes the first example and further includes, wherein the detector is positioned between the column and the sample stage. A third example of the system optionally includes one or more of the first and second examples, and further includes, wherein the magnetic field is provided by a magnetic lens positioned in the column for focusing the charged particle beam towards the sample stage. A fourth example of the method optionally includes one or more of the first and third examples, and further includes, wherein no pressure limiting aperture is coupled between the column and the sample chamber. A fifth example of the method optionally includes one or more of the first and fourth examples, and further includes, wherein the detection space extends from a sample surface irradiated by the charged particle beam into the column. A sixth example of the method optionally includes one or more of the first and fifth examples, and further includes, wherein the detector provides an electric field in the detection space, and trajectories of the charged particles in the detection space is controlled by the magnetic field and the electric field.

What is claimed is:

1. A method for imaging a sample, comprising:
providing a gas in a detection space;
providing a magnetic field in the detection space;
irradiating the sample with a charged particle beam while providing a plasma in the detection space;
detecting charged particles emitted from the sample into the detection space responsive to the irradiation; and
forming an image based on the detected charged particles.

2. The method of claim 1, wherein the gas is a mixture of multiple gas species.

3. The method of claim 1, wherein the plasma includes at least one gas molecule species with a molar weight less than 5.

4. The method of claim 1, wherein the plasma includes hydrogen.

5. The method of claim 1, wherein the plasma is provided by ionizing at least one species of the gas provided in the detection space.

6. The method of claim 1, wherein the sample is immersed in the magnetic field.

7. The method of claim 1, wherein the charged particles emitted from the sample are detected by a detector, and the detection space is defined by a position and a structure of the detector.

8. The method of claim 1, wherein the sample is positioned within a sample chamber with a pressure less than 0.05 torr.

9. The method of claim 1, wherein the charged particle beam is an electron beam, and the detected charged particles are secondary electrons.

10. The method of claim 1, further comprising adjusting an amount of the gas and an amount of the plasma provided to the detection space based on the formed image.

11. A method for imaging a sample, comprising:
providing a magnetic field in a detection space;
scanning the sample with an electron beam while providing a gas and a plasma in the detection space;
detecting charged particles emitted from the sample; and
forming a sample image based on the detected charged particles.

12. The method of claim 11, wherein the electron beam is directed to the sample through an optical column, and a pressure in the detection space is the same as a pressure in a part of the optical column.

13. The method of claim 11, further comprising forming a second sample image by recording a specimen current.

14. A system for imaging a sample, comprising:
a sample chamber;
a sample stage positioned in the sample chamber for holding the sample;
a column coupled to the sample chamber for generating a charged particle beam towards the sample stage;
a gas source coupled to the sample chamber;
a detector for detecting charged particles in a detection space; and
a controller with instructions stored in a non-transitory memory, the controller is configured to:
provide a gas to the detection space with the gas source;
provide a magnetic field in the detection space;
irradiate the sample with the charged particle beam while providing a plasma in the detection space;
detect, via the detector, charged particles emitted from the sample into the detection space responsive to the irradiation; and
form an image based on the detected charged particles.

15. The system of claim 14, further comprising a plasma generator coupled to the sample chamber, and wherein providing the plasma in the detection space includes ionizing at least one gas species of the provided gas with the plasma generator.

16. The system of claim 14, wherein the detector is positioned between the column and the sample stage.

17. The system of claim 14, wherein the magnetic field is provided by a magnetic lens positioned in the column for focusing the charged particle beam towards the sample stage.

18. The system of claim 14, wherein no pressure limiting aperture is coupled between the column and the sample chamber.

19. The system of claim 18, wherein the detection space extends from a sample surface irradiated by the charged particle beam into the column.

20. The system of claim 14, wherein the detector provides an electric field in the detection space, and trajectories of the charged particles in the detection space is controlled by the magnetic field and the electric field.

* * * * *